US009905686B2

United States Patent
Sugimoto et al.

(10) Patent No.: US 9,905,686 B2
(45) Date of Patent: Feb. 27, 2018

(54) INSULATED GATE BIPOLAR TRANSISTOR WITH IMPROVED ON/OFF RESISTANCE

(71) Applicant: TOYOTA JIDOSHA KABUSHIKI KAISHA, Toyota-shi, Aichi-ken (JP)

(72) Inventors: Masahiro Sugimoto, Toyota (JP); Yukihiko Watanabe, Nagakute (JP); Shinichiro Miyahara, Nagoya (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/075,683

(22) Filed: Mar. 21, 2016

(65) Prior Publication Data

US 2016/0284839 A1 Sep. 29, 2016

(30) Foreign Application Priority Data

Mar. 24, 2015 (JP) .................................. 2015-060633

(51) Int. Cl.
*H01L 29/78* (2006.01)
*H01L 29/16* (2006.01)
*H01L 29/10* (2006.01)
*H01L 29/06* (2006.01)

(52) U.S. Cl.
CPC ........ *H01L 29/7813* (2013.01); *H01L 29/063* (2013.01); *H01L 29/0696* (2013.01); *H01L 29/1095* (2013.01); *H01L 29/1608* (2013.01)

(58) Field of Classification Search
CPC ............... H01L 29/7813; H01L 29/063; H01L 29/1095

See application file for complete search history.

(56) References Cited

U.S. PATENT DOCUMENTS

| | | | | |
|---|---|---|---|---|
| 6,566,691 B1* | 5/2003 | Inoue | .................. | H01L 29/7397 257/133 |
| 6,953,968 B2* | 10/2005 | Nakamura | ............ | H01L 29/402 257/301 |
| 8,384,151 B2* | 2/2013 | Pfirsch | ................ | H01L 29/0834 257/328 |
| 8,492,867 B2* | 7/2013 | Yamamoto | .......... | H01L 29/0619 257/493 |
| 8,975,139 B2* | 3/2015 | Miyahara | .......... | H01L 29/66068 257/76 |
| 9,023,692 B2* | 5/2015 | Yoshida | ............ | H01L 29/66128 257/172 |
| 9,209,296 B2* | 12/2015 | Toyoda | .......... | H01L 21/823412 |

(Continued)

FOREIGN PATENT DOCUMENTS

| | | |
|---|---|---|
| JP | 2005-142240 A | 6/2005 |
| JP | 2013-211512 A | 10/2013 |

*Primary Examiner* — Meiya Li
*Assistant Examiner* — Shih Tsun A Chou
(74) *Attorney, Agent, or Firm* — Andrews Kurth Kenyon LLP

(57) ABSTRACT

In a plane view of the front surface of the semiconductor substrate, the source region and the first contact region are arranged adjacent to each other in a direction along the gate trench in an area being in contact with a side surface of the gate trench, and the second contact region is arranged adjacent to the source region and the first contact region in an area apart from the gate trench. The impurity concentration of the first contact region is lower than the impurity concentration of the second contact region.

1 Claim, 11 Drawing Sheets

(56) References Cited

U.S. PATENT DOCUMENTS

| | | | |
|---|---|---|---|
| 9,318,599 B2* | 4/2016 | Sung | H01L 29/7813 |
| 9,337,185 B2* | 5/2016 | Pfirsch | H01L 27/0635 |
| 9,379,225 B2* | 6/2016 | Kimura | H01L 29/7397 |
| 2003/0042537 A1* | 3/2003 | Nakamura | H01L 29/402 257/328 |
| 2011/0309464 A1* | 12/2011 | Yamamoto | H01L 29/0619 257/493 |
| 2012/0146091 A1* | 6/2012 | Tanabe | H01L 29/0696 257/139 |
| 2012/0181575 A1* | 7/2012 | Pfirsch | H01L 29/0834 257/139 |
| 2012/0199900 A1* | 8/2012 | Oosawa | H01L 29/41741 257/330 |
| 2013/0105889 A1* | 5/2013 | Fujiwara | H01L 29/66068 257/330 |
| 2013/0221402 A1* | 8/2013 | Ogura | H01L 29/7395 257/139 |
| 2013/0330896 A1* | 12/2013 | Miyahara | H01L 29/66068 438/270 |
| 2014/0008718 A1* | 1/2014 | Toyoda | H01L 21/823412 257/330 |
| 2014/0070270 A1* | 3/2014 | Yoshida | H01L 29/66128 257/140 |
| 2014/0334212 A1* | 11/2014 | Hashimoto | H01L 27/0727 363/131 |
| 2015/0076595 A1* | 3/2015 | Sung | H01L 29/7813 257/334 |
| 2015/0179637 A1* | 6/2015 | Pfirsch | H01L 27/0635 257/144 |
| 2015/0236127 A1* | 8/2015 | Miyahara | H01L 29/66734 257/77 |

* cited by examiner

INSULATED GATE BIPOLAR TRANSISTOR WITH IMPROVED ON/OFF RESISTANCE

CROSS-REFERENCE TO RELATED APPLICATIONS

This application claims priority to Japanese Patent Application No. 2015-060633 filed on Mar. 24, 2015, the entire contents of which are hereby incorporated by reference into the present application.

TECHNICAL FIELD

The present application relates to a MOSFET (metal-oxide-semiconductor field-effect transistor).

DESCRIPTION OF RELATED ART

Japanese Patent Application Publication No. 2005-142240 A discloses a MOSFET including: a semiconductor substrate configured of SiC; and a front surface electrode provided on a front surface of the semiconductor substrate. The semiconductor substrate includes: an n-type drift region; a p-type base region provided on a front surface side of the drift region; and a gate trench extending from the front surface of the semiconductor substrate, piercing the base region, and reaching the drift region. Further, the semiconductor substrate includes: an n-type source region provided in an area exposed on the front surface of the semiconductor substrate and on a front surface side of the base region; and a p-type contact region provided in an area exposed on the front surface of the semiconductor substrate and on the front surface side of the base region. In a plane view of the semiconductor substrate, the source region is arranged in a direction along the gate trench in an area being in contact with a side surface of the gate trench, and the contact region is arranged adjacent to the source region in an area apart from the gate trench.

SUMMARY

In the technology disclosed in Japanese Patent Application Publication No. 2005-142240, when the MOSFET is on, a channel is formed in an area in the p-type base region that is in contact with the gate trench. Then, electrons flow from the source region to the drift region via the channel formed in the base region. On the other hand, when the MOSFET is turned off, an instantaneously high surge voltage may be applied in a forward direction to the semiconductor substrate. Then, the application of the high voltage to the semiconductor substrate causes a large quantity of holes to be generated in the semiconductor substrate by the avalanche effect. The holes thus generated flow from the base region of the semiconductor substrate to the front surface electrode via the contact region. If, at this occasion, the contact region of the semiconductor substrate is small, the large quantity of holes flows through a smaller region. Therefore, it becomes more difficult for the holes to flow from the base region to the front surface electrode via the contact region. Further, since the hole mobility of a semiconductor substrate configured of SiC is lower than that configured of another material, it is even harder for the holes to flow to the front surface electrode via the contact region. This makes it harder for the large quantity of holes generated by the avalanche effect to flow to the front surface electrode via the contact region, thus undesirably causing a decrease in avalanche resistance.

Alternatively, it is conceivable that the contact region of the semiconductor substrate may be made larger. However, simply making the contact region larger causes the source region, which is adjacent to the contact region, to be smaller and causes an increase in resistance accordingly when the MOSFET is on.

To address this problem, the present disclosure provides a technology that enables a reduction in resistance when a MOSFET is on and enables an increase in avalanche resistance when the MOSFET is turned off.

A MOSFET disclosed herein comprises a semiconductor substrate configured of SiC; and a front surface electrode provided on a front surface of the semiconductor substrate. The semiconductor substrate comprises: an n-type drift region; a p-type base region provided on a front surface side of the drift region; and a gate trench extending from the front surface of the semiconductor substrate, piercing the base region, and reaching the drift region. Further, the semiconductor substrate comprises: an n-type source region provided in an area exposed on the front surface of the semiconductor substrate and on a front surface side of the base region; a p-type first contact region provided in an area exposed on the front surface of the semiconductor substrate and on the front surface side of the base region; and a p-type second contact region provided in an area exposed on the front surface of the semiconductor substrate and on the front surface side of the base region. In a plane view of the front surface of the semiconductor substrate, the source region and the first contact region are arranged adjacent to each other in a direction along the gate trench in an area being in contact with a side surface of the gate trench, and the second contact region is arranged adjacent to the source region and the first contact region in an area apart from the gate trench. An impurity concentration of the first contact region is lower than an impurity concentration of the second contact region.

According to this configuration, when the MOSFET is on, a channel is formed in an area in the p-type base region that is in contact with the gate trench. Similarly, a channel is formed in an area in the p-type first contact region that is in contact with the gate trench. Usually, a contact region provided in a semiconductor substrate has a higher impurity concentration for lower contact resistance. In the technology disclosed herein, on the contrary, the first contact region has a lower impurity concentration. This lowers a threshold for forming a channel in the first contact region, thus making it easier for a channel to be formed in the first contact region. Moreover, in a state where channels are formed in the first contact region and the base region of the semiconductor substrate, electrons flow from the source region to the drift region via the channel formed in the first contact region and the channel formed in the base region. Since the electrons flow via the channel formed in the first contact region and the channel formed in the base region, the electrons flow through a wide area in the semiconductor substrate. This enables a reduction in resistance when the MOSFET is on.

In a MOSFET, simply making a contact region larger causes a source region adjacent to the contact region to be smaller and causes an increase in resistance accordingly when the MOSFET is on. On the other hand, the technology disclosed herein makes the impurity concentration of the first contact region lower instead of simply making a contact region larger. This enables a reduction in resistance when the MOSFET is on.

On the other hand, when the MOSFET is turned off, an instantaneously high surge voltage may be applied in a forward direction to the semiconductor substrate in some cases. Then, a large quantity of holes generated by the avalanche effect flows from the base region of the semiconductor region to the front surface electrode via a contact region (i.e., the first contact region and the second contact region). Note here that since the contact region is made larger by the semiconductor substrate including the first contact region and the second contact region, holes flow via the contact region thus made larger, which makes easier for the holes to flow to the front surface electrode. This allows the large quantity of holes generated by the avalanche effect to smoothly flow to the front surface electrode via the contact region (i.e., the first contact region and the second contact region), thus enabling an increase in avalanche resistance. Usually, no attention is paid to the flow of holes in a MOSFET. However, the technology disclosed herein directs attention to holes generated by the avalanche effect and thus brings out a configuration in which holes flow more easily.

Thus, the MOSFET enables a reduction in resistance when the MOSFET is on and enables an increase in avalanche resistance when the MOSFET is turned off.

DETAILED DESCRIPTION

Figure 1:
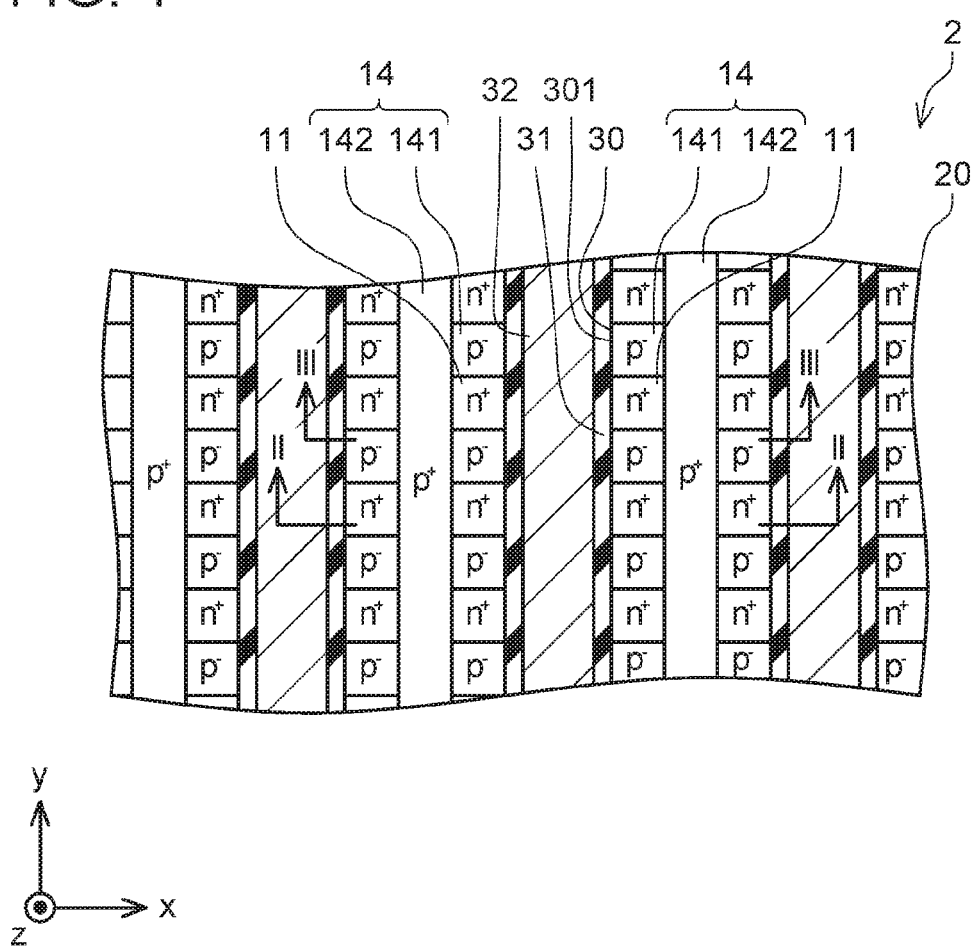
FIG. 1 is a plane view of a MOSFET according to an embodiment.
Figure 2:
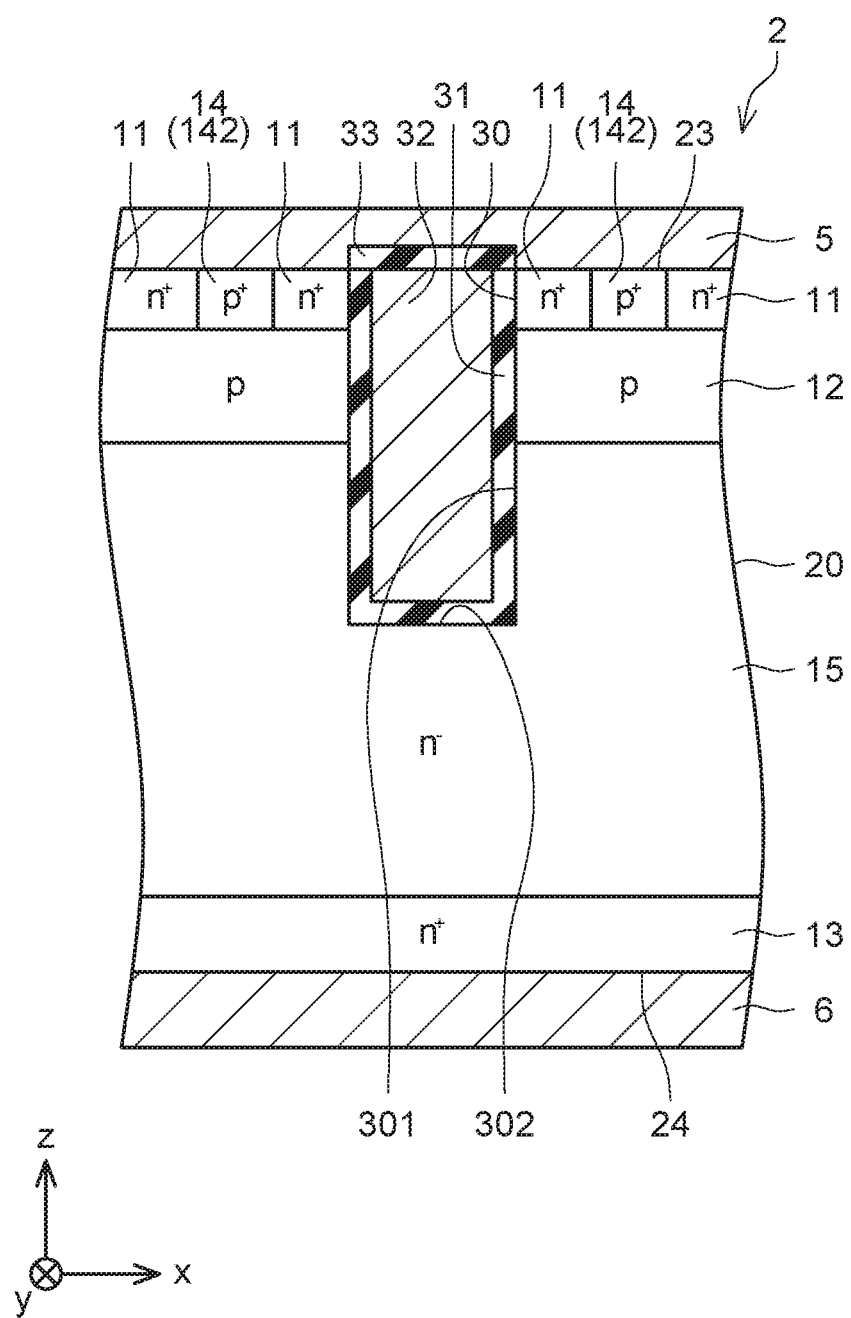
FIG. 2 is a cross-sectional view taken along a line II-II in FIG. 1.
Figure 3:
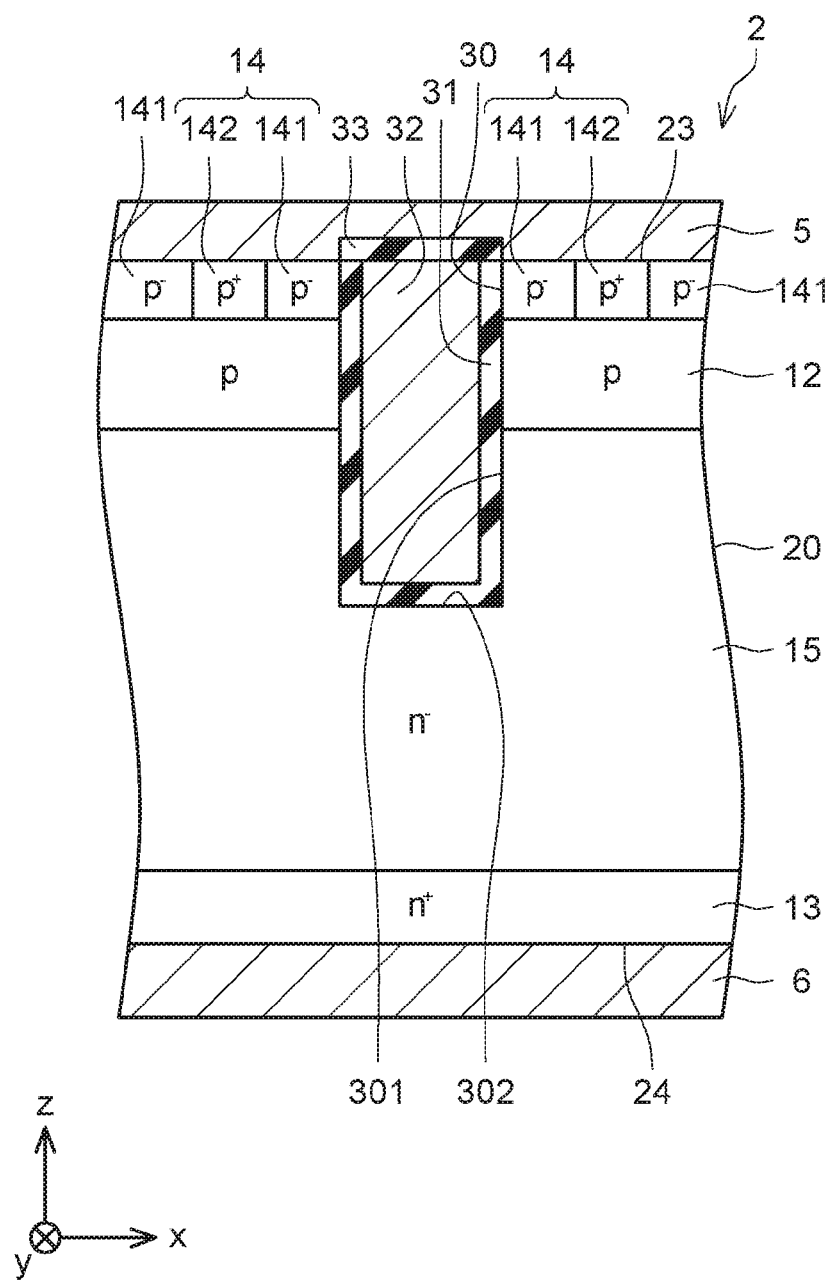
FIG. 3 is a cross-sectional view taken along a line III-III in FIG. 1.

As shown in FIGS. 1 to 3, a MOSFET 2 according to an embodiment comprises a semiconductor substrate 20, a front surface electrode 5 provided on a front surface 23 of the semiconductor substrate 20, and a rear surface electrode 6 provided on a rear surface 24 of the semiconductor substrate 20. It should be noted that, for higher viewability, FIG. 1 omits to illustrate the front surface electrode 5.

The front surface electrode 5 and the rear surface electrode 6 are configured of metal such as aluminum (Al) and copper (Cu). The front surface electrode 5 covers the front surface 23 of the semiconductor substrate 20. The rear surface electrode 6 covers the rear surface 24 of the semiconductor substrate 20.

The semiconductor substrate 20 is configured of SiC (silicon carbide). The hole mobility of a semiconductor substrate configured of SiC is lower than that configured of another material. For example, a mobility of holes in a semiconductor substrate configured of SiC ranges from approximately 40 to 115 ($cm^2/V \cdot s$), and a mobility of holes in a semiconductor substrate configured of Si is approximately 600 ($cm^2/V \cdot s$).

The semiconductor substrate 20 comprises semiconductor elements. The semiconductor substrate 20 comprises a plurality of gate trenches 30. Further, the semiconductor substrate 20 comprises a drain region 13, a drift region 15, and a base region 12. The drain region 13, the drift region 15, and the base region 12 are arranged in this order from a rear surface 24 side to a front surface 23 side. Further, the semiconductor substrate 20 comprises source regions 11 and contact regions 14 (i.e., first contact regions 141 and second contact regions 142).

As shown in FIG. 1, each of the gate trenches 30 extends along a y direction in a plane view of the front surface 23 of the semiconductor substrate 20. The plurality of gate trenches 30 extend along the y direction and in parallel to each other. The plurality of gate trenches 30 are placed at regular intervals along an x direction. In a cross-sectional view of the semiconductor substrate 20, as shown in FIGS. 2 and 3, each of the gate trenches 30 extends from the front surface 23 of the semiconductor substrate 20 toward the rear surface 24 (i.e., along a z direction). In a cross-section shown in FIG. 2, each gate trench 30 extends from the front surface 23 of the semiconductor substrate 20, pierces the corresponding source regions 11 and the base region 12, and reaches the drift region 15. In a cross-section shown in FIG. 3, the gate trench 30 extends from the front surface 23 of the semiconductor substrate 20, pierces the corresponding first contact region 141 and the base region 12, and reaches the drift region 15. A gate electrode 32 and a gate insulating film 31 are provided inside each of the gate trenches 30.

The gate electrodes 32 are for example configured of aluminum or polysilicon. Each gate electrode 32 is accommodated inside the corresponding gate trench 30. The gate electrode 32 is accommodated on an inner side than the gate insulating film 31. An interlayer insulating film 33 is placed on top of each of the gate electrodes 32. Each interlayer insulating film 33 insulates the corresponding gate electrode 32 and the front surface electrode 5 from each other.

The gate insulating films 31 are for example configured of silicon oxide ($SiO_2$). Each gate insulating film 31 is provided on an inner surface of the corresponding gate trench 30. The gate insulating film 31 covers a side surface 301 and a bottom surface 302 of the gate trench 30. The gate insulating film 31 is placed between the gate electrode 32 and the semiconductor substrate 20. The gate insulating film 31 insulates the gate electrode 32 and the semiconductor substrate 20 from each other.

The drain region 13 is an n-type region. The drain region 13 has a high impurity concentration. The drain region 13 is provided on a rear surface side of the drift region 15. The drain region 13 is provided in an area exposed on the rear surface 24 of the semiconductor substrate 20. The drain region 13 is in ohmic contact with the rear surface electrode 6.

The drift region 15 is an n-type region. An impurity concentration of the drift region 15 is lower than the impurity concentration of the drain region 13. The drift region 15 is provided on a front surface side of the drain region 13. The drift region 15 is provided between the base region 12 and the drain region 13.

The base region 12 is a p-type region. The base region 12 has a low impurity concentration. The base region 12 is provided on a front surface side of the drift region 15 and in an area being in contact with the gate trenches 30. When the gate electrodes 32 are brought to an on-potential, channels are formed in portions of the base region 12 that are in contact with the gate trenches 30.

The source regions 11 are n-type regions. The source regions 11 have a high impurity concentration. The source regions 11 are provided on a front surface side of the base region 12 and in an area being in contact with the gate trenches 30. The source regions 11 are in the form of islands in an area exposed on the front surface 23 of the semiconductor substrate 20. The source regions 11 are in ohmic contact with the front surface electrode 5.

The contact regions 14 include the first contact regions 141 and the second contact regions 142. The contact regions 14 (i.e., the first contact regions 141 and the second contact regions 142) are p-type regions. An impurity concentration of each first contact region 141 is lower than the impurity concentration of the base region 12. An impurity concentration of each second contact region 142 is higher than the impurity concentration of the base region 12. The impurity concentration of each first contact region 141 is lower than the impurity concentration of each second contact region 142. That is, the following relationship holds: impurity concentration of the second contact region 142>impurity concentration of the base region 12>impurity concentration of the first contact region 141.

Each of the first contact regions 141 is provided on the front surface side of the base region 12 and in an area being in contact with the corresponding gate trench 30. Each of the second contact region 142 is provided on the front surface side of the base region 12 and in an area apart from the gate trenches 30. The contact regions 14 (i.e., the first contact regions 141 and the second contact regions 142) are provided in an area exposed on the front surface 23 of the semiconductor substrate 20. Each of the first contact regions 141 is in contact with the front surface electrode 5. Each of the second contact regions 142 is in ohmic contact with the front surface electrode 5. Since the impurity concentration of the first contact region 141 is lower than the impurity concentration of the second contact region 142, a contact resistance between the first contact region 141 and the front surface electrode 5 is higher than a contact resistance between the second contact region 142 and the front surface electrode 5.

In a plane view of the front surface 23 of the semiconductor substrate 20, as shown in FIG. 1, the source regions 11 and the first contact regions 141 are arranged adjacent to each other in a direction along the gate trenches 30. The source regions 11 and the first contact regions 141 are alternately aligned in the y direction. In the y direction, each first contact region 141 is arranged between the two source regions 11, and each source region 11 is arranged between the two first contact regions 141.

In the x direction, each second contact region 142 is arranged adjacent to the corresponding source regions 11 and the corresponding first contact regions 141. Each source region 11 and the corresponding second contact region 142 are aligned in the x direction. Each first contact region 141 and the corresponding second contact region 142 are aligned in the x direction. In the x direction, each second contact region 142 is arranged between the corresponding source regions 11 and between the corresponding first contact regions 141. The second contact regions 142 extend along the y direction.

When the MOSFET 2 thus configured is used, a voltage (forward voltage) that makes the rear surface electrode 6 positive is applied between the front surface electrode 5 and the rear surface electrode 6. Further, an on-potential (i.e., a potential equal to or higher than a potential required for a channel to be formed in the base region 12) is applied to the gate electrodes 32. The application of the on-potential to the gate electrodes 32 causes a channel to be formed in an area in the base region 12 that is in contact with the gate trenches 30. Further, a channel is formed in an area in the first contact regions 141 that is in contact with the gate trenches 30. This causes the MOSFET 2 to be turned on. Then, electrons flow from the front surface electrode 5 to the rear surface electrode 6 via the source regions 11, the channel formed in the first contact regions 141, the channel formed in the base region 12, the drift region 15 and the drain region 13.

On the other hand, when the gate electrodes 32 are brought to an off-potential, the channels formed in the base region 12 and the first contact regions 141 disappear. This causes the MOSFET 2 to be turned off. When the MOSFET 2 is turned off, an instantaneously high surge voltage may be applied in a forward direction between the front surface electrode 5 and the rear surface electrode 6. As a result, an instantaneously high voltage is applied to the semiconductor substrate 20, and a large quantity of holes is generated by the avalanche effect. The large quantity of holes generated by the avalanche effect flows to the front surface electrode 5 via the drift region 15, the base region 12, and the contact regions 14 (i.e., the first contact regions 141 and the second contact regions 142).

As is evident from these descriptions, the MOSFET 2, as shown in FIG. 1, also comprises the p-type first contact regions 141, as well as the n-type source regions 11, in an area in the front surface 23 of the semiconductor substrate 20 that is in contact with the gate trenches 30. For this reason, a region where the source regions 11 are in contact with the gate trenches 30 is smaller than in a conventional MOSFET. However, the MOSFET 2 achieves low on-resistance. That is, since the impurity concentration of the first contact regions 141 is low, a channel is easily formed in the first contact regions 141. For this reason, when the MOSFET 2 is on, a channel is formed in the first contact regions 141, as well as the base region 12. Therefore, electrons flow from the source regions 11 to the drift region 15 via the channel formed in the first contact regions 141 and the channel formed in the base region 12. Since regions of contact between the first contact regions 141 and the gate insulating films 31 (i.e., the channel formed in the first contact regions 141) serves as current pathways, electrons flow through a wide area in the semiconductor substrate 20. This enables a reduction in resistance when the MOSFET 2 is on.

Meanwhile, according to the configuration described above, when the MOSFET 2 is turned off, a large quantity of holes may be generated in the semiconductor substrate 20 by the avalanche effect. However, the semiconductor substrate 20 also comprises the first contact regions 141 provided in positions being in contact with the gate trenches 30, as well as the second contact regions 142 provided in positions apart from the gate trenches 30. This makes the contact regions 14 larger, thus making it easier for the holes to flow to the front surface electrode 5 via the contact regions 14. Even if a large quantity of holes is generated by the avalanche effect when the MOSFET 2 is turned off, an increase in avalanche resistance can be achieved, as the holes smoothly flow to the front surface electrode 5 via the contact regions 14 (i.e., the first contact regions 141 and the second contact regions 142). Therefore, the MOSFET 2 enables a reduction in resistance when the MOSFET 2 is on and enables an increase in avalanche resistance when the MOSFET 2 is turned off.

Further, in the MOSFET 2, the impurity concentration of the first contact regions 141 is lower than the impurity concentration of the base region 12. According to this configuration, a channel is formed in the first contact regions 141 before a channel is formed in the base region 12, as a threshold for forming a channel in the first contact regions 141 is lower than a threshold for forming a channel in the base region 12. This makes it easier for electrons to flow through the first contact regions 141 and allows the electrons to flow through a wider area in the semiconductor substrate 20, thus enabling a reduction in resistance when the MOSFET 2 is on.

Further, in the MOSFET 2, the impurity concentration of the second contact regions 142 is higher than the impurity concentration of the base region 12. This configuration lowers the resistance between the second contact regions 142 and the front surface electrode 5, thus making it easier for holes to flow to the front surface electrode 5 via the second contact regions 142 and enabling an increase in avalanche resistance.

Figure 4:
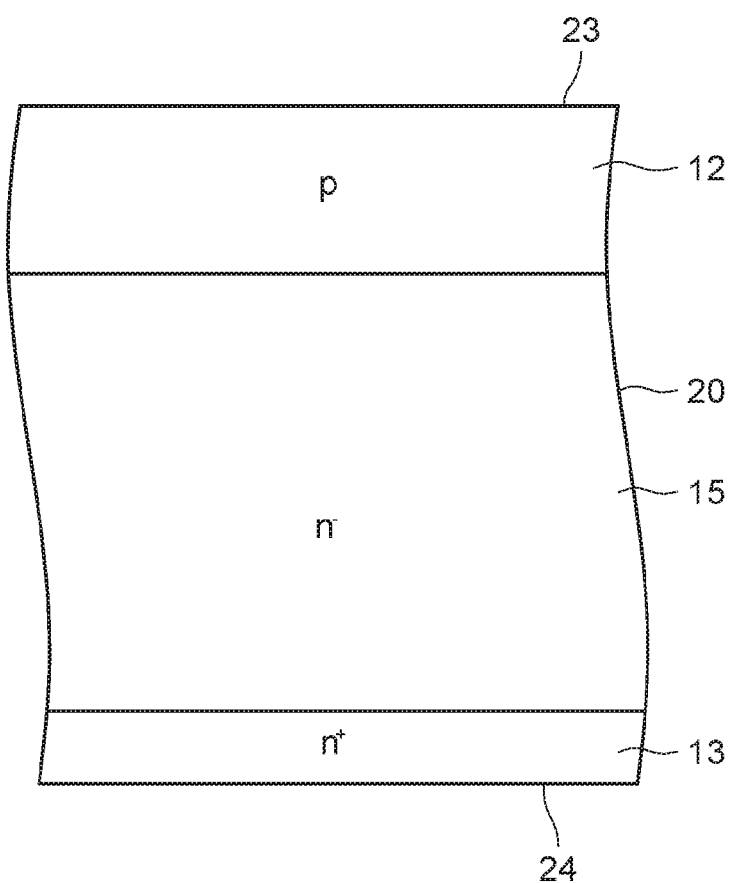
FIG. 4 is a diagram (1) for explaining a method for manufacturing MOSFET according to the embodiment.
Figure 4:
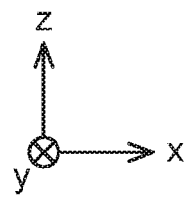

The following will describe an example of a method of manufacturing a MOSFET. As shown in FIG. 4, when a MOSFET is manufactured, an n-type drift region 15 configured of SiC is formed on a front surface of an n$^+$-type SiC substrate 13 and a p-type base region 12 configured of SiC is formed on a front surface of the drift region 15. The drift region 15 and the base region 12 are formed by epitaxial growth.

Figure 5:
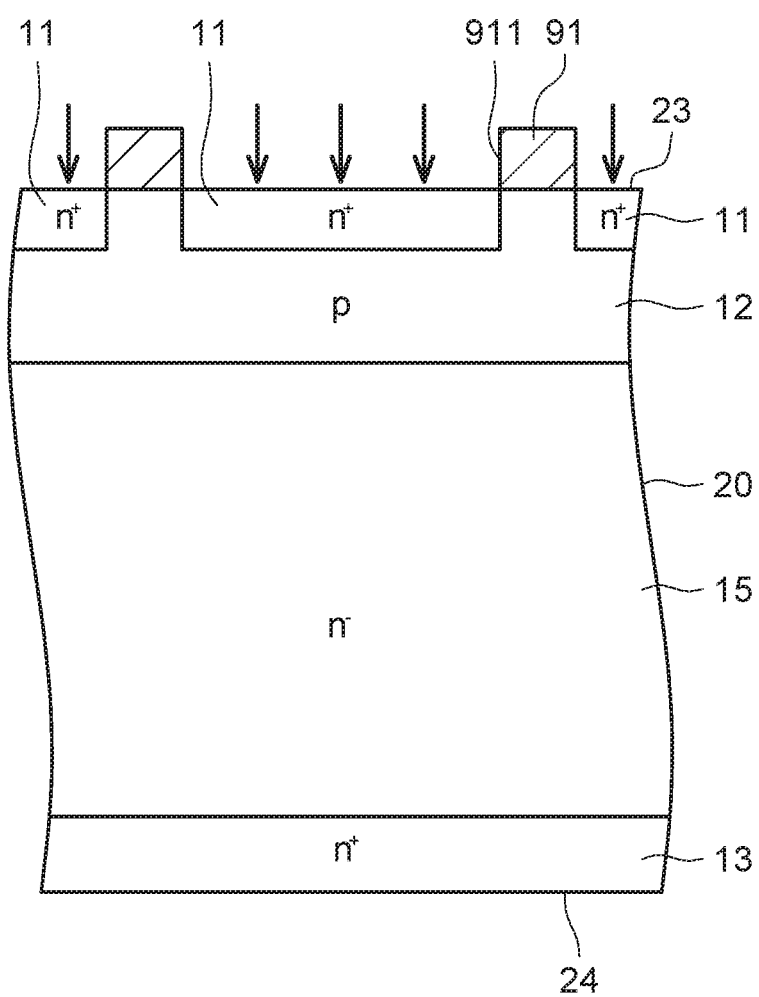
FIG. 5 is a diagram (2) for explaining the method for manufacturing the MOSFET according to the embodiment.

Next, as shown in FIG. 5, a mask 91 is formed on the front surface 23 of the semiconductor substrate 20. The mask 91 includes openings 911. Each opening 911 is provided in an area in the semiconductor substrate 20 where corresponding source region 11 is to be formed. Further, n-type impurities are implanted into the front surface 23 of the semiconductor substrate 20. The n-type impurities are implanted at a high concentration. The n-type impurities are implanted into parts of the p-type base region 12 through the openings 911 of the mask 91. This causes the n-type source regions 11 to be formed at a high concentration. The source regions 11 are formed in areas exposed on the front surface 23 of the semiconductor substrate 20. It should be noted that a cross-section shown in FIG. 5 corresponds to the cross-section shown in FIG. 2.

Figure 6:
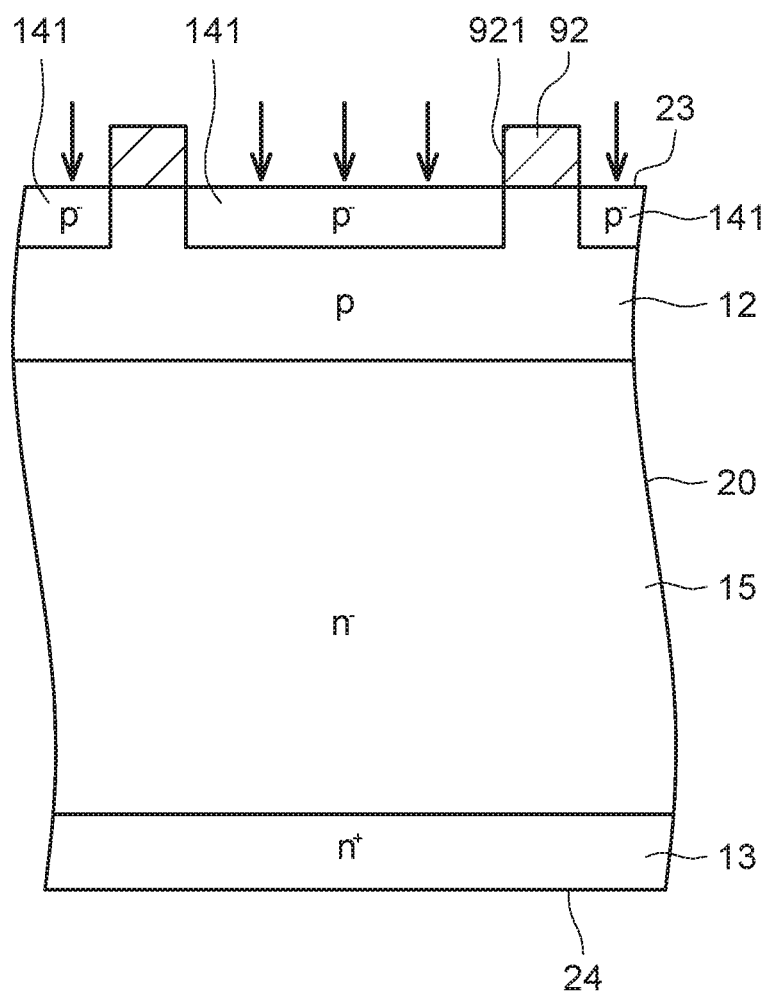
FIG. 6 is a diagram (3) for explaining the method for manufacturing the MOSFET according to the embodiment.

Next, as shown in FIG. 6, a mask 92 is formed on the front surface 23 of the semiconductor substrate 20. The mask 92 includes openings 921. Each opening 921 is provided in an area in the semiconductor substrate 20 where the corresponding first contact region 141 is to be formed. Further, n-type impurities are implanted into the front surface 23 of the semiconductor substrate 20. The n-type impurities are implanted at a low concentration. The n-type impurities are implanted into a part of the p-type base region 12 through the openings 921 of the mask 92. The implantation of the n-type impurities into the p-type base region 12 reduces the difference in concentrations between the p-type impurities and the n-type impurities. This in turn reduces an effective concentration of p-type impurities (concentration of holes) in the base region 12. This causes the p-type first contact regions 141 to be formed. The first contact regions 141 are formed in areas exposed on the front surface 23 of the semiconductor substrate 20. It should be noted that a cross-section shown in FIG. 6 corresponds to the cross-section shown in FIG. 3.

Figure 7:
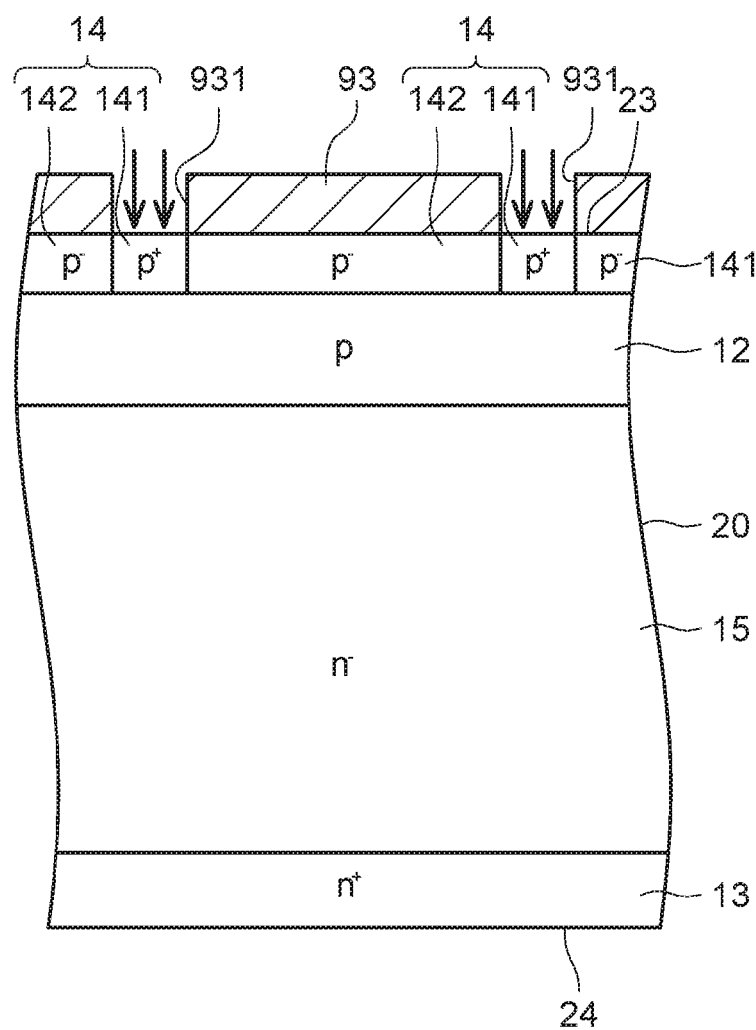
FIG. 7 is a diagram (4) for explaining the method for manufacturing the MOSFET according to the embodiment.

Next, as shown in FIG. 7, a mask 93 is formed on the front surface 23 of the semiconductor substrate 20. The mask 93 includes openings 931. Each opening 931 is provided in an area in the semiconductor substrate 20 where the corresponding second contact region 142 is to be formed. Further, p-type impurities are implanted into the front surface 23 of the semiconductor substrate 20. The p-type impurities are implanted at a high concentration. The p-type impurities are implanted into parts of the p-type base region 12 through the openings 931 of the mask 93. This causes the p-type second contact regions 142 to be formed at a high concentration. The second contact regions 142 are formed in areas exposed on the front surface 23 of the semiconductor substrate 20. It should be noted that a cross-section shown in FIG. 7 corresponds to the cross-section shown in FIG. 3.

Figure 8:
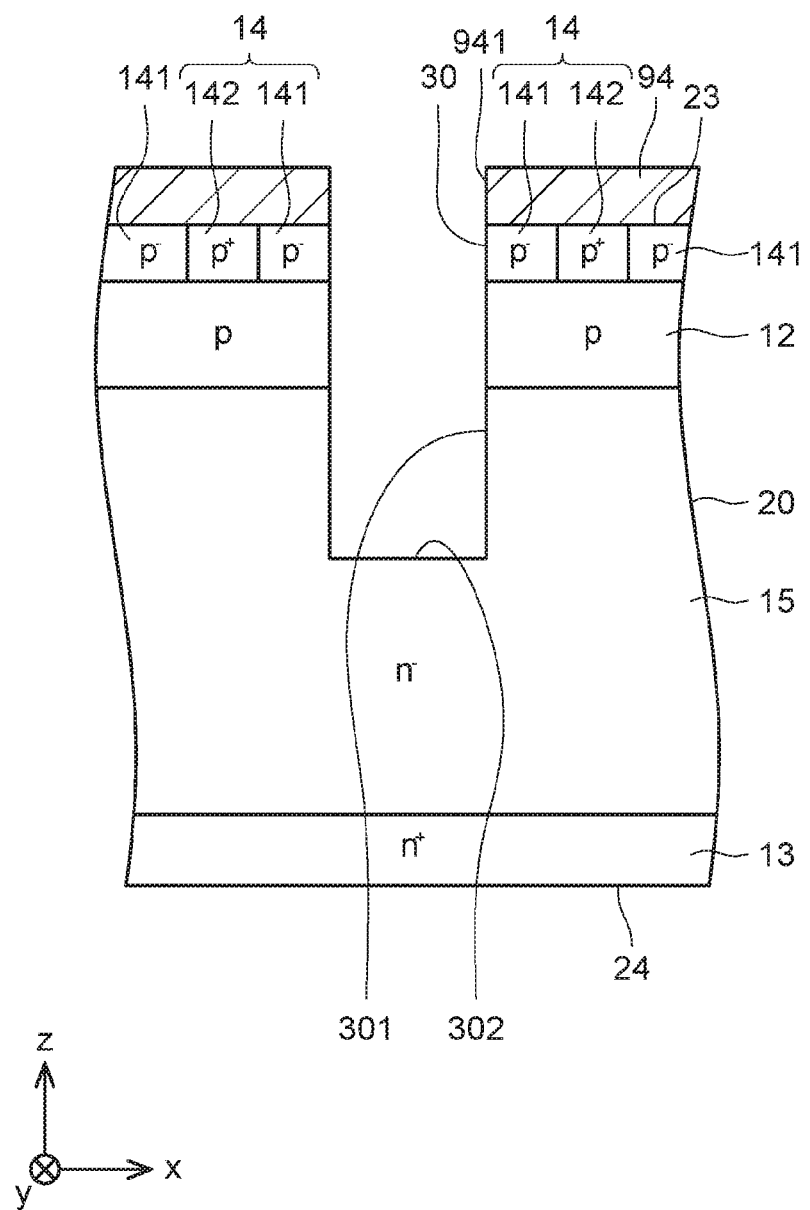
FIG. 8 is a diagram (5) for explaining the method for manufacturing the MOSFET according to the embodiment.

Next, as shown in FIG. 8, a mask 94 is formed on the front surface 23 of the semiconductor substrate 20. The mask 94 includes openings 941. Each opening 941 is provided in an area in the semiconductor substrate 20 where the corresponding gate trench 30 is to be formed. Further, the front surface 23 of the semiconductor substrate 20 is etched. Portions of the semiconductor substrate 20 that are exposed from the openings 941 of the mask 94 are etched. This causes the gate trenches 30 to be formed. Each gate trench 30 extends from the front surface 23 of the semiconductor substrate 20, pierces the corresponding first contact regions 141 and the base region 12, and reaches the drift region 15. Further, each gate trench 30 also extends from the front surface 23 of the semiconductor substrate 20 and pierces the corresponding source regions 11 (not illustrated). It should be noted that a cross-section shown in FIG. 8 corresponds to the cross-section shown in FIG. 3.

Figure 9:
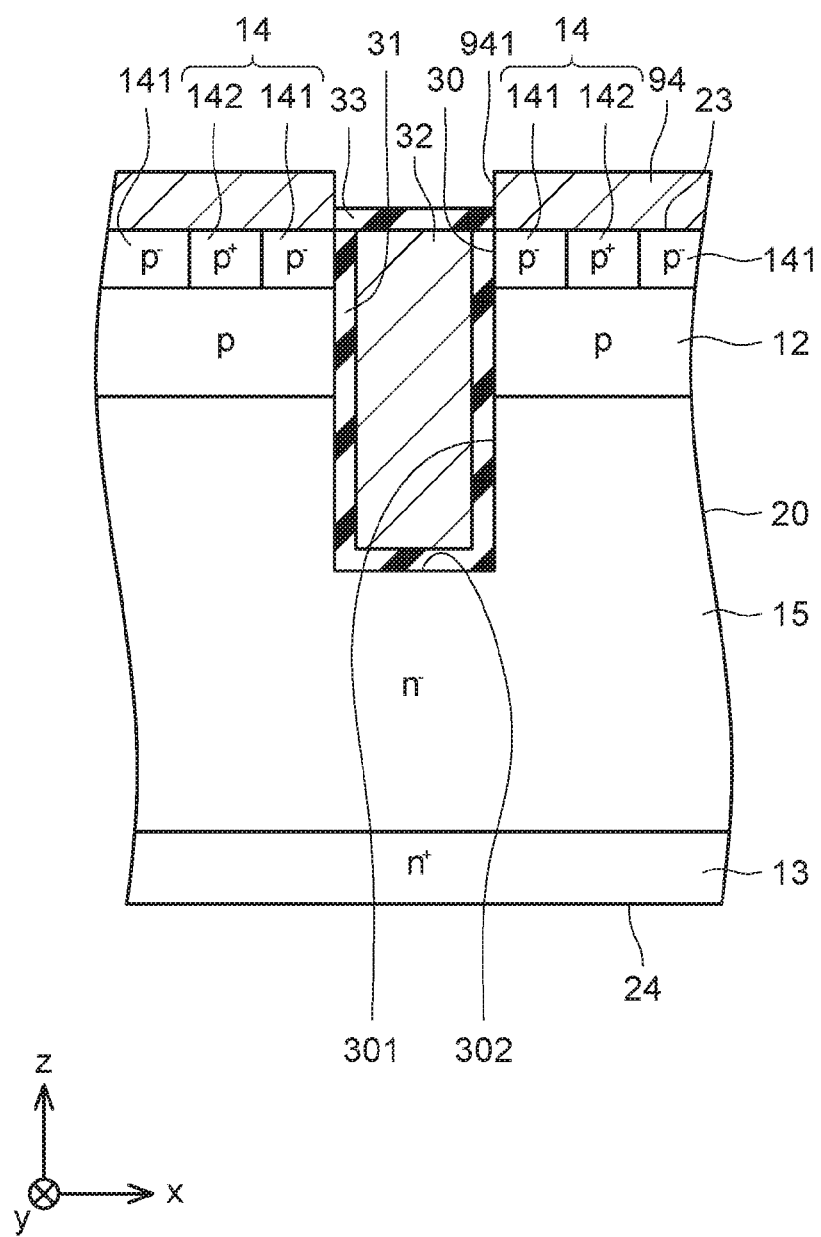
FIG. 9 is a diagram (6) for explaining the method for manufacturing the MOSFET according to the embodiment.

Next, as shown in FIG. 9, the gate insulating films 31 and the gate electrodes 32 are formed inside the respective gate trenches 30. Further, the interlayer insulating films 33 are formed on tops of the respective gate electrodes 32.

Figure 10:
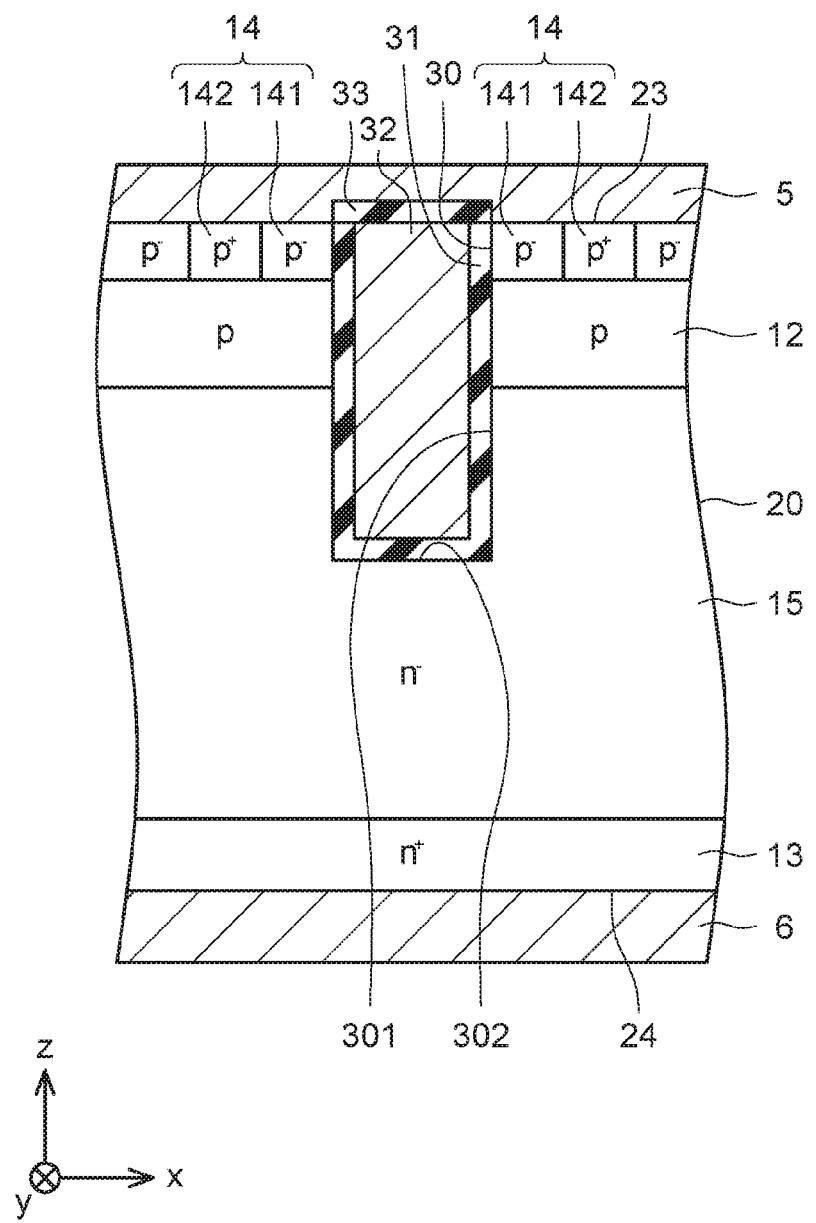
FIG. 10 is a diagram (7) for explaining the method for manufacturing the MOSFET according to the embodiment.

Next, as shown in FIG. 10, the front surface electrode 5 is formed on the front surface 23 of the semiconductor substrate 20. Further, the rear surface electrode 6 is formed on the rear surface 24 of the semiconductor substrate 20. In this way, the MOSFET 2 is formed.

Figure 11:
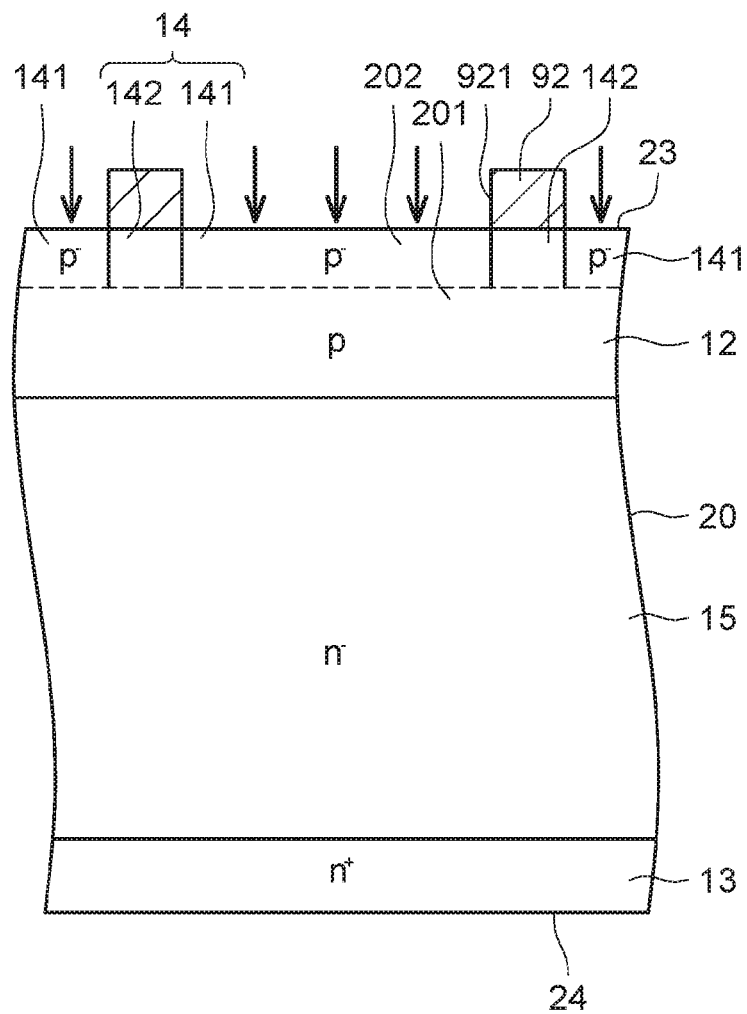
FIG. 11 is a diagram for explaining a method for manufacturing a MOSFET according to another embodiment.

One embodiment has been described above. However, a specific aspect is not limited to the embodiment described above. In the following description, components which are the same as those described above are given the same reference signs, and as such, are not described. In the embodiment described above, the base region 12 is formed by epitaxial growth on the drift region 15. However, the method of forming the base region 12 is not limited to the embodiment described above. Further, although the first contact regions 141 are formed by implanting n-impurities at the low concentration into the p-type base region 12, the method of forming the first contact regions 141 is not limited to the embodiment described above. In another embodiment, as shown in FIG. 11, the p-type base region 12 and the p-type first contact regions 141 may be formed by implanting p-type impurities into the semiconductor substrate 20 in a multistage manner. In this case, p-type impurities are implanted into a deep area 201 in the semiconductor substrate 20 on the front surface side of the drift region 15. This causes the base region 12 to be formed on the front surface side of the drift region 15. Next, p-type impurities are implanted into a shallow area 202 in the semiconductor substrate 20 on the front surface side of the drift region 15. This causes the first contact regions 141 to be formed on the front surface side of the base region 12. A concentration of the p-type impurities implanted into the shallow area 202 is tower than a concentration of the p-type impurities implanted into the deep area 201.

Further, in the embodiment described above, the impurity concentration of the first contact regions 141 is lower than the impurity concentration of the base region 12. However, this configuration does not imply any limitation. The impurity concentration of the first contact region 141 may be equal to the impurity concentration of the base region 12.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Some of the features characteristic to below-described embodiments will herein be listed. It should be noted that the respective technical elements are independent of one another, and are useful solely or in combinations.

1. The impurity concentration of the first contact region may be lower than an impurity concentration of the base region.

According to this configuration, a channel is formed in the first contact region before a channel is formed in the base region, as a threshold for forming a channel in the first contact region is lower than a threshold for forming a channel in the base region. This makes it easier for electrons to flow through the first contact region and allows the electrons to flow through a wider area in the semiconductor substrate, thus enabling a reduction in resistance when the MOSFET is on.

2. The impurity concentration of the second contact region may be higher than the impurity concentration of the base region.

According to this configuration, the resistance between the second contact region and the front surface electrode becomes low, thus making it easier for holes to flow to the front surface electrode via the second contact region and enabling an increase in avalanche resistance.

What is claimed is:

1. A metal-oxide-semiconductor field-effect transistor (MOSFET) comprising:
   a semiconductor substrate configured of silicon carbide (SiC); and
   a front surface electrode provided on a front surface of the semiconductor substrate,
   wherein the semiconductor substrate comprises:
      a n-type drift region; a p-type base region of a first impurity concentration provided on a front surface side of the drift region;
      a gate trench extending from the front surface of the semiconductor substrate, piercing the base region, and reaching the drift region;
      a n-type source region provided in a first area, wherein the first area exposed on the front surface of the semiconductor substrate and on a front surface side of the base region;
      a p-type first contact region of a second impurity concentration provided in a second area, wherein the second area exposed on the front surface of the semiconductor substrate and on the front surface side of the base region; and
      a p-type second contact region of a third impurity concentration provided in a third area, wherein the third area exposed on the front surface of the semiconductor substrate and on the front surface side of the base region, in a plane view of the front surface of the semiconductor substrate, the source region and the first contact region are arranged abutting each other in a first direction along the gate trench in a fourth area being in contact with a side surface of the gate trench, and the second contact region is arranged in a second direction parallel to the first direction, and abutting the source region and the first contact region in a fifth area apart from the gate trench, and
   wherein the first impurity concentration is higher than the second impurity concentration, and lower than the third impurity concentration.

* * * * *